(12) United States Patent
Zhang et al.

(10) Patent No.: US 9,507,001 B2
(45) Date of Patent: Nov. 29, 2016

(54) MAGNETIC RESONANCE IMAGING METHOD

(71) Applicants: Qiong Zhang, Shenzhen (CN); Cong Zhao, Shenzhen (CN)

(72) Inventors: Qiong Zhang, Shenzhen (CN); Cong Zhao, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 832 days.

(21) Appl. No.: 13/923,757

(22) Filed: Jun. 21, 2013

(65) Prior Publication Data

US 2013/0342204 A1   Dec. 26, 2013

(30) Foreign Application Priority Data

Jun. 21, 2012   (CN) .......................... 2012 1 0206517

(51) Int. Cl.
*G01R 33/54*     (2006.01)
*G01R 33/567*    (2006.01)
*G01R 33/56*     (2006.01)
*G01R 33/563*    (2006.01)

(52) U.S. Cl.
CPC ......... *G01R 33/543* (2013.01); *G01R 33/5676* (2013.01); *G01R 33/5607* (2013.01); *G01R 33/5635* (2013.01)

(58) Field of Classification Search
CPC ............ G01R 33/543; G01R 33/5607; G01R 33/5635; G01R 33/5676
See application file for complete search history.

(56) References Cited

U.S. PATENT DOCUMENTS

| | | | | | |
|---|---|---|---|---|---|
| 4,720,678 A | * | 1/1988 | Glover | ............. | G01R 33/56509 324/309 |
| 6,127,825 A | * | 10/2000 | Goto | ................ | G01R 33/56518 324/307 |
| 6,218,834 B1 | * | 4/2001 | Goto | ................ | G01R 33/56518 324/307 |
| 6,853,191 B1 | * | 2/2005 | Miller | .............. | G01R 33/56509 324/307 |
| 7,719,274 B2 | * | 5/2010 | Park | ................. | G01R 33/56554 324/307 |
| 9,170,312 B2 | * | 10/2015 | Larson | ............... | G01R 33/4608 |
| 9,329,252 B2 | * | 5/2016 | Bammer | ................ | G01R 33/56 |
| 9,395,430 B2 | * | 7/2016 | Park | ................... | G01R 33/5611 |

\* cited by examiner

*Primary Examiner* — Dixomara Vargas
(74) *Attorney, Agent, or Firm* — Schiff Hardin LLP

(57) ABSTRACT

In a magnetic resonance imaging method and apparatus, navigation data are collected in a navigation acquisition timeslot of a scanning sequence. A determination as to whether to accept or reject echo data that are subsequently collected in multiple echo acquisition timeslots is made. If the phase relationship of the navigation data and the reference data in k-space is greater than or equal to the reference value, the collected echo data are accepted and if the aforementioned phase in k-space is less than the reference value, the collected echo data will be rejected, and sequential scanning will be performed again, and the navigation data again will be collected using the navigation acquisition timeslot, and the aforementioned determination is repeated.

7 Claims, 4 Drawing Sheets

MAGNETIC RESONANCE IMAGING METHOD

BACKGROUND OF THE INVENTION

Field of the Invention

The present invention relates to the technical field of magnetic resonance imaging, and in particular to a resonance imaging method regarding the carotid artery.

Description of the Prior Art

In magnetic resonance imaging of the carotid artery, magnetic resonance black blood imaging is becoming a powerful tool for carotid atherosclerosis research. In carotid artery magnetic resonance black blood imaging, pre-processing of carotid artery magnetic resonance imaging can be performed by applying methods such as double inversion recovery (DIR) or flow sensitive dephasing (FSD), etc. However, a problem of current magnetic resonance black blood imaging is that the scanning time is somewhat long, so that swallowing or other laryngeal movements are likely to occur during the process of acquiring data, causing unclear images (artifacts) as a result. Besides magnetic resonance black blood imaging, other imaging methods also have the problem of being affected by local movements so that the final image is unclear.

Specifically, swallowing can hardly be avoided during the process of carotid artery vessel wall imaging due to the long duration of scanning. FIG. 1 is a schematic diagram of a navigation sequence and an imaging sequence in the prior art, wherein the arc is a curve representing the magnitude of local movements.

As shown in FIG. 1, as regards the navigation sequence, firstly it is required to manually locate the position of a local movement, then a navigation pulse scanning is used regarding the position, thus detecting whether the local movement of the object under detection has entered an acceptance window, i.e. the window in which the magnitude and range of the local movement will not result in a huge effect on image sequence scanning, and only in the case that the local movement has fallen into the acceptance window, is imaging sequence scanning performed.

A three-dimensional turbo spin-echo (SPACE) sequence is a typical scanning mode in three-dimensional magnetic resonance black blood imaging. FIG. 2 is a time sequence schematic diagram of a three-dimensional turbo spin-echo sequence in the prior art. As shown in FIG. 2, in the three-dimensional turbo spin-echo sequence, firstly a 90° excitation radio frequency pulse is applied to a radio frequency (RF) signal, then a 180° rephasing radio frequency pulse is applied after the 90° excitation radio frequency pulse, then subsequent other radio frequency pulses are applied; and in the direction of slice-select gradient Gs, phase encoding gradient Gp and readout gradient Gr, a corresponding slice-select gradient, phase encoding gradient and readout gradient are respectively applied. During the process of scanning, an analog-digital converter (ADC) collects a signal, wherein the analog-digital converter (ADC) collects echo signals in the data acquisition timeslots (ACST) represented by dash areas.

The effect of local movements on the final image can be reduced by the aforementioned measures, but such a navigation sequence module will undoubtedly increase the complexity of the system and waste much time, especially in the case that local movements randomly happen and the probability of occurrence is relatively low, the necessity of using such a module is lower.

The above-described current solution has the following aspects to be improved regarding local movements: the system is relatively complicated, and it is required to add an additional navigation sequence module; the operation is relatively complicated, and it is required to manually locate local movements; it is relatively time-wasting; and the navigation pulse will generate black belt artifacts on the final imaging and affect the imaging quality.

SUMMARY OF THE INVENTION

The present invention is a magnetic resonance imaging method to perform sequential scanning and collecting echo data from a number of echo acquisition timeslots, wherein navigation data is collected using a navigation acquisition timeslot. Whether to accept or reject the echo data collected in said plurality of echo acquisition timeslots is determined according to the relationship between the phase relationship of the navigation data and reference data in k-space and a reference value. If the phase relationship of the navigation data and the reference data in k-space is greater than or equal to the reference value, then the collected echo data will be accepted. If the phase relationship of the navigation data and the reference data in k-space is less than the reference value, then the collected echo data will be rejected, and the sequential scanning will be performed again, and the navigation data will be collected using the navigation acquisition timeslot, and subsequent steps thereof will be performed. Magnetic resonance image data is generated only from the accepted echo data.

Preferably, the navigation acquisition timeslot is before the multiple echo acquisition timeslots and/or after the multiple echo acquisition timeslots.

Preferably, the interval between the navigation acquisition timeslot and an echo acquisition timeslot adjacent thereto is less than or equal to the interval between adjacent echo acquisition timeslots.

Preferably, a number of sets of said navigation data acquired in a set time are averaged as said reference data.

Preferably, the reference value is set according to empirical values.

It can be seen from the above solution that in accordance with the embodiments of the present invention, there is no need to add an additional navigation sequence module, and there is no need to manually position local movements, which saves time and will not generate black belt artifacts in a navigation pulse, thus solving the problems in the prior art.

DESCRIPTION OF THE PREFERRED EMBODIMENTS

The following abbreviations are used herein—

Analog-digital converter: ADC, Data acquisition timeslot: ACST, and Navigation acquisition timeslot: NVGT.

The basis of the technical solution of the carotid artery black blood magnetic resonance imaging method according to the present invention is applying a navigation acquisition timeslot prior to a data acquisition timeslot of an analog-digital converter, collecting a navigation echo in the navigation acquisition timeslot by the analog-digital converter, and determining whether to accept or reject data acquired by this sequence using the phase relationship between the navigation echo and a reference echo in k-space. If the phase relationship between the navigation echo and the reference echo in k-space is greater than or equal to the reference value, then the data required by this sequence will be accepted; otherwise, the data required by this sequence will be rejected.

Figure 1:
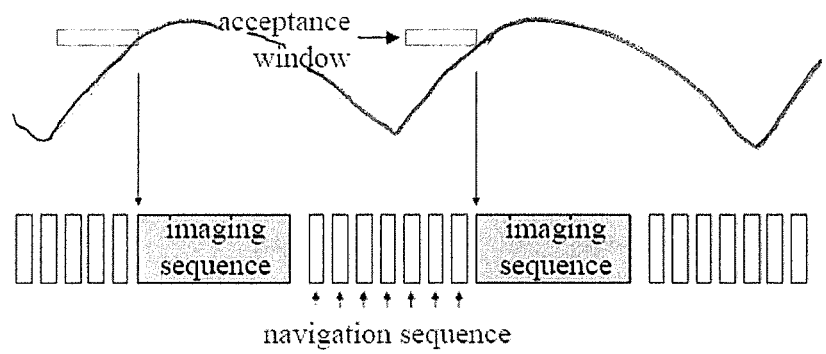
FIG. 1 is a schematic diagram of a navigation sequence and an imaging sequence in the prior art.
Figure 2:
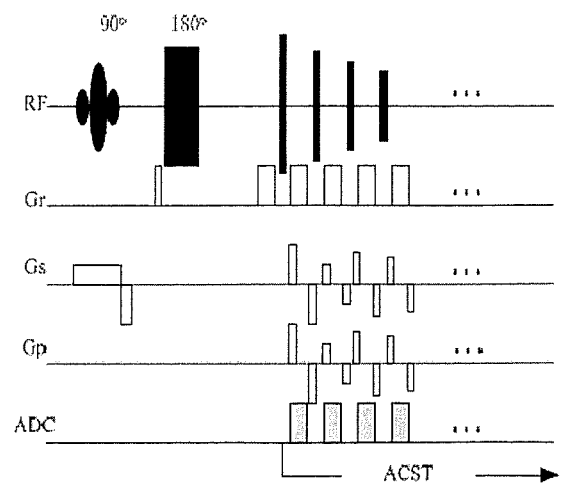
FIG. 2 is a time sequence schematic diagram of a three-dimensional turbo spin-echo sequence in the prior art.
Figure 3:
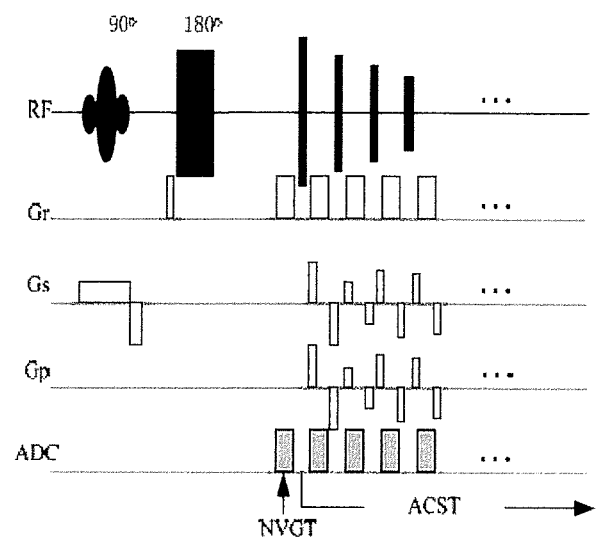
FIG. 3 is a time sequence schematic diagram of a three-dimensional turbo spin-echo sequence according to particular embodiments of the present invention.

FIG. 3 shows a time sequence schematic diagram of a three-dimensional turbo spin-echo sequence according to particular embodiments of the present invention. In this particular embodiment, as shown in FIG. 3, a navigation timeslot (NVGT) is applied prior to a data acquisition timeslot (ACST) of an analog-digital converter (ADC); a navigation echo is collected in the navigation acquisition timeslot (NVGT) by the analog-digital converter (ADC), and whether to accept or reject data acquired by a three-dimensional turbo spin-echo sequence this time is determined using the phase relevance between the navigation echo and a reference navigation echo in k-space.

K-space is an abstract space, and is also called a Fourier space. Magnetic resonance imaging data is arranged at specific positions in k-space according to different spatial frequencies, which spatial frequencies are used to describe certain energy propagating in the form of waves in space; therefore, k-space can also be understood as a space filled with the raw data of MR signals having spatial orientation encoding information. Each MR image has k-space data corresponding thereto, and by Fourier transform performed on the k-space data, the MR images can be reconstructed.

The MR imaging data is actually arranged at specific positions in k-space according to different energy levels, and the energy in k-space follows an exponential decline from the middle to two sides; therefore, the energy in k-space is mainly distributed in a concentrated way in the middle of k-space and the two sides adjacent to the middle.

Figure 4:
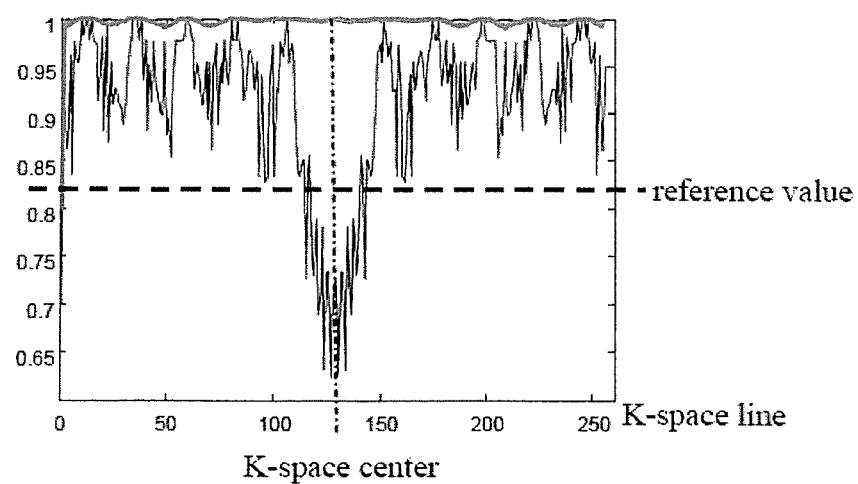
FIG. 4 is a curve of the phase relevance and magnitude relevance between a navigation echo and a reference echo in k-space when a local movement appears.

Specifically, FIG. 4 is a curve of the phase relationship and magnitude relationship between a navigation echo and a reference echo in k-space when a local movement appears, wherein the thick line represents magnitude relevance, while the thin line represents phase relevance. As shown in FIG. 4, when a local movement happens, although the magnitude relevance between the navigation echo and the reference echo in k-space does not have apparent changes, the phase relationship between the navigation echo and the reference echo has apparently changed in k-space center and the two sides close to the center, i.e. the phase relationship between the navigation echo and the reference echo has decreased significantly in k-space center and the two sides close to the center.

Therefore, the situation of a local movement can be detected by applying a navigation acquisition timeslot (NVGT) prior to a data acquisition timeslot (ACST) of an analog-digital converter (ADC) and using the phase relevance between the navigation echo acquired in the navigation acquisition timeslot (NVGT) and a reference echo in k-space: if the phase relevance between the navigation echo and the reference echo decreases significantly in k-space center and the two sides close to the center, then it indicates that a local movement appears, and therefore the data acquired by this sequence will be rejected; otherwise, it indicates that a local movement does not appear, and therefore the data acquired by this sequence will be accepted.

Figure 5:
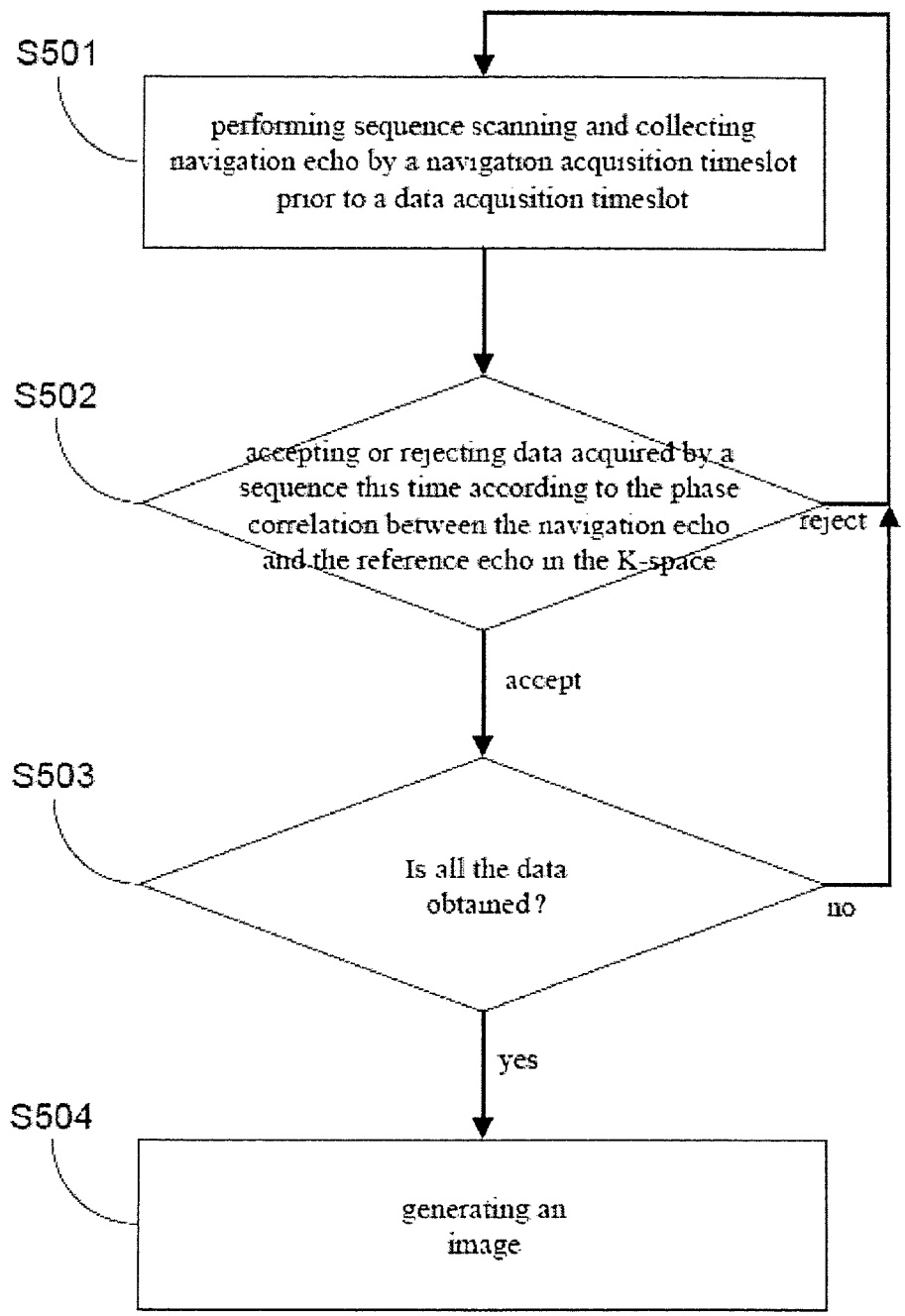
FIG. 5 is a flowchart of a carotid artery magnetic resonance imaging method according to embodiments of the present invention.

FIG. 5 is a flowchart of a carotid artery magnetic resonance black blood imaging method according to particular embodiments of the present invention. Particular embodiments of the present invention will be introduced in detail by each step hereinafter with reference to FIG. 5, taking three-dimensional turbo spin-echo sequence scanning as an example.

Step S501, three-dimensional turbo spin-echo sequence scanning is performed, wherein an analog-digital converter collects a navigation echo before a data acquisition timeslot through a navigation acquisition timeslot.

As shown in FIG. 4, before the data acquisition timeslot (ACST) which collects echo signals of an analog-digital converter (ADC), a navigation echo is collected through a navigation acquisition timeslot (NVGT). The navigation echo is obtained by averaging echo signals simultaneously accepted by a number of channels in one coil, and a user can also weight the echo signals accepted by the plurality of channels as required so as to obtain the navigation echo. The time interval between the navigation acquisition timeslot (NVGT) and the first data acquisition timeslot (ACST) is less than or equal to the time interval between adjacent data acquisition timeslots (ACST).

Step S502, whether to accept or reject data acquired by this sequential scanning is determined according to the phase relationship between the navigation echo and the reference echo in k-space.

The phase relationship between the navigation echo and the reference echo in k-space is compared with a reference value: if the phase relationship between the navigation echo and the reference echo in k-space is greater than the reference value, then a decision will be made to accept data acquired by this sequence; and if the phase relationship between the navigation echo and the reference echo in k-space is less than the reference value, then a decision will be made to reject data acquired by this sequence and step S501 and subsequent steps will be performed continuously.

The reference value can be obtained by manual setting or automatic system setting; if the phase relationship between the navigation echo and the reference echo in k-space is less than the reference value, i.e. the phase relationship between the navigation echo and the reference echo in k-space is insufficient, then it indicates that at this moment, the three-dimensional turbo spin-echo sequence is greatly affected by a local movement; therefore, the data acquired at this moment is rejected.

Step S503, whether all the data is obtained is judged.

Whether all the data is obtained is determined, and if not all the data has been obtained, then step S501 and subsequent steps thereof will be performed continuously on the object under detection, and if all the data has been obtained, then step S504 will be performed.

Step S504, an image is generated.

All the data obtained is used for generating a carotid artery magnetic resonance black blood image.

Figure 6:
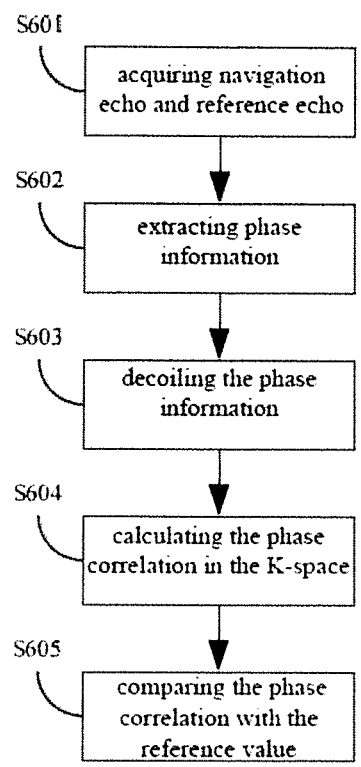
FIG. 6 is a flowchart of step S502 of the carotid artery magnetic resonance imaging method according to embodiments of the present invention.

FIG. 6 is a substep diagram of step S502 of the carotid artery magnetic resonance black blood imaging method according to particular embodiments of the present invention. Step S502 will be described in detail by each substep hereinafter with reference to FIG. 6.

Step S601, a navigation echo and a reference echo are obtained.

The navigation echo is obtained by averaging echo signals accepted by a plurality of different channels, and a user can also weight the echo signals accepted by the number of different channels as required so as to obtain the navigation echo.

Before formally acquiring the navigation echo used for judging whether to accept or reject data acquired by this sequence, a number of navigation echoes acquired within a set time is averaged as the reference echo, wherein the set time should include at least one swallowing period in order to fully reflect the change range of the navigation echo.

Step S602, phase information is extracted from the acquired navigation echo and reference echo.

Step S603, the extracted phase information is decoiled.

Step S604, the relationship between the decoiled phase information about the navigation echo and the decoiled phase information about the reference echo is calculated.

The decoiled phase information about the reference echo is calculated, and then the relationship between the decoiled phase information about the navigation echo and the decoiled phase information about the reference echo is calculated. For the relationship calculation, for example, unitary linear recursive analysis can be applied to ascertain the relationship between the decoiled phase information and the decoiled phase information about the reference echo, and those skilled in the art can also use other relationship calculation methods to ascertain the relationship between the decoiled phase information and the decoiled phase information about the reference echo.

Step S605, the relationship between the decoiled phase information and the reference phase information is compared with a reference value.

The reference value can be obtained by manual setting or automatic system setting; if the phase relevance between the navigation echo and the reference echo in k-space is less than the reference value, i.e. the phase relationship of navigation echo signals in k-space is insufficient, then at this moment, the three-dimensional turbo spin-echo sequence is greatly affected by a random movement; therefore, the data acquired at this moment will be rejected.

In carotid artery vessel wall imaging, a transversal relaxation time $T_1$-weighted contrast ratio is usually used. Taking a three-dimensional turbo spin-echo sequence as an example, the sequence time of 140 milliseconds is greatly shorter than a swallowing period; therefore, it is only required to set a navigation echo pulse prior to a data acquisition pulse, or it is only required to set a navigation echo pulse prior to a data acquisition pulse. However, in the case of a relatively long repetition time $T_R$, a navigation acquisition timeslot can be set prior to and after a data acquisition timeslot, and therefore one sequence will generate two navigation echo signals. If the phase relationship between any one navigation echo signal and a reference signal in k-space is less than a reference value, then data obtained by this sequence will be rejected.

Besides the three-dimensional turbo spin-echo sequence (SPACE) selected by the present invention, a two-dimensional turbo spin-echo sequence (TSE), etc. can also be selected to perform carotid artery magnetic resonance black blood imaging.

Since an unmodified scanning sequence only applies a navigation pulse prior to a data acquisition pulse of an analog-digital converter, the present invention is also applicable to other pre-processing methods which perform carotid artery magnetic resonance imaging in addition to carotid artery magnetic resonance black blood imaging, and can reduce the negative effect on image quality resulting from a local movement as well.

Compared to the prior art, firstly, the technical solution of the present invention does not require manual positioning; and then, the navigation pulse of the technical solution of the present invention does not track a tissue or object boundary; therefore, black belt artifacts will not appear in the final image as the prior art.

Figure 7A:
FIG. 7A is a carotid artery image obtained according to a three-dimensional turbo spin-echo sequence of the prior art.
Figure 7B:
FIG. 7B is a carotid artery image obtained according to a three-dimensional turbo spin-echo sequence of particular embodiments of the present invention.

In order to verify the practicability of the present invention, this method was used to scan the carotid artery of a healthy object under detection. The experimental scanning is completed by a Siemens 3.0T whole-body imager, supplemented by a four-channel carotid artery coil, and applied is a transversal relaxation time $T_1$-weighted nonselective excited three-dimensional turbo spin-echo sequence. FIG. 7A is a carotid artery image obtained according to a three-dimensional turbo spin-echo sequence of the prior art, and FIG. 7B is a carotid artery image obtained according to a three-dimensional turbo spin-echo sequence of particular embodiments of the present invention. As shown in FIGS. 7A and 7B, the quality of the carotid artery image obtained by applying a three-dimensional turbo spin-echo sequence of the technical solution of the present invention is superior to that of the carotid artery image obtained by applying a three-dimensional turbo spin-echo sequence of the prior art.

Although modifications and changes may be suggested by those skilled in the art, it is the intention of the inventor to embody within the patent warranted hereon all changes and modifications as reasonably and properly come within the scope of his contribution to the art.

We claim as our invention:

1. A magnetic resonance imaging method for sequential scanning of a subject and acquiring echo data from the subject in a plurality of echo acquisition timeslots, comprising:

operating a magnetic resonance data acquisition unit to execute a magnetic resonance data acquisition sequence comprising excitation and nuclear spins that produces a plurality of echoes in a plurality of echo acquisition timeslots, and acquiring magnetic resonance data in said echo acquisition timeslots, as echo data exhibiting a phase;

operating said magnetic resonance data acquisition unit to produce, in said data acquisition sequence, navigation data exhibiting a phase, and acquiring said navigation data in a navigation acquisition timeslot in said data acquisition sequence;

entering said navigation data and said echo data into a memory as k-space data in k-space;

from a processor, accessing said memory and automatically determining whether to accept or reject the echo data in k-space dependent on a relationship between the phase of the navigation data and the phase of reference data, by accepting said echo data, as accepted data, if said relationship is greater than or equal to a reference value, and rejecting said echo data, as rejected data, if said relationship is less than said reference value;

from said processor, when said k-space data contain rejected data, causing said magnetic resonance data acquisition unit to be operated to repeat said magnetic resonance data acquisition sequence until said k-space data do not contain rejected data; and when said k-space data do not contain rejected data, making said accepted data available as a data file at an output of said processor.

2. A magnetic resonance imaging method as claimed in claim 1 comprising operating said magnetic resonance data acquisition unit with said navigation acquisition timeslot before said plurality of echo acquisition timeslots in said magnetic resonance data acquisition sequence.

3. A magnetic resonance imaging method as claimed in claim 1 comprising operating said magnetic resonance data acquisition unit with said navigation acquisition timeslot after said plurality of echo acquisition timeslots in said magnetic resonance data acquisition sequence.

4. A magnetic resonance imaging method as claimed in claim 1 comprising operating said magnetic resonance data acquisition unit with said navigation acquisition timeslot before and after said plurality of echo acquisition timeslots in said magnetic resonance data acquisition sequence.

5. A magnetic resonance imaging method as claimed in claim 1 comprising operating said magnetic resonance data acquisition unit with an interval, in said magnetic resonance data acquisition sequence, between said navigation acquisition timeslot and one of said echo acquisition timeslots adjacent thereto being less than or equal to an interval between adjacent echo acquisition timeslots.

6. A magnetic resonance imaging method as claimed in claim 1 comprising operating said magnetic resonance data acquisition unit in said magnetic resonance data acquisition sequence to acquire a plurality of sets of said navigation data within a predetermined time, and averaging said plurality of sets of navigation data to form said reference data.

7. A magnetic resonance imaging method as claimed in claim 1 comprising generating said reference value as a set generated according to empirical values.

* * * * *